(12) United States Patent
Kushnarenko

(10) Patent No.: US 6,774,704 B2
(45) Date of Patent: Aug. 10, 2004

(54) CONTROL CIRCUIT FOR SELECTING THE GREATER OF TWO VOLTAGE SIGNALS

(75) Inventor: Alexander Kushnarenko, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 72 days.

(21) Appl. No.: 10/282,484

(22) Filed: Oct. 28, 2002

(65) Prior Publication Data
US 2004/0080358 A1 Apr. 29, 2004

(51) Int. Cl.[7] .............................. H02J 3/01; H02J 1/10
(52) U.S. Cl. ...................... 327/530; 327/534; 327/537
(58) Field of Search ................................ 327/530, 534, 327/537; 365/185.23, 189.07, 189.09, 189.11

(56) References Cited

U.S. PATENT DOCUMENTS 6,157,581 A * 12/2000 Higashi ................. 365/189.07
6,166,957 A * 12/2000 Chung et al. .......... 365/185.23
6,288,963 B1 * 9/2001 Kato ..................... 365/189.09

* cited by examiner

Primary Examiner—Trong Phan
(74) Attorney, Agent, or Firm—Bever, Hoffman & Harms, LLP; Patrick T. Bever (57) ABSTRACT

A voltage control circuit for a non-volatile memory (NVM) array or other integrated circuit that uses a comparator circuit, a switch control circuit, and a pair of PMOS switches to selectively couple an output node to the greater of two voltage signals. An output gain provided by the comparator circuit is used to control the coupling process such that the voltage difference needed to switch between the first and second voltage signals is minimized. The high or low comparator output signal is transmitted to the switch control circuit, which utilizes a pair of level shifters to control the pair of PMOS switches, which in turn couple one of the first and second voltage sources to the output node.

12 Claims, 6 Drawing Sheets

FIG. 6

CONTROL CIRCUIT FOR SELECTING THE GREATER OF TWO VOLTAGE SIGNALS

FIELD OF THE INVENTION

This invention relates to integrated circuits, and in particular to the comparison and selection of the greater of two voltage signals in an integrated circuit.

BACKGROUND OF THE INVENTION

Figure 1:
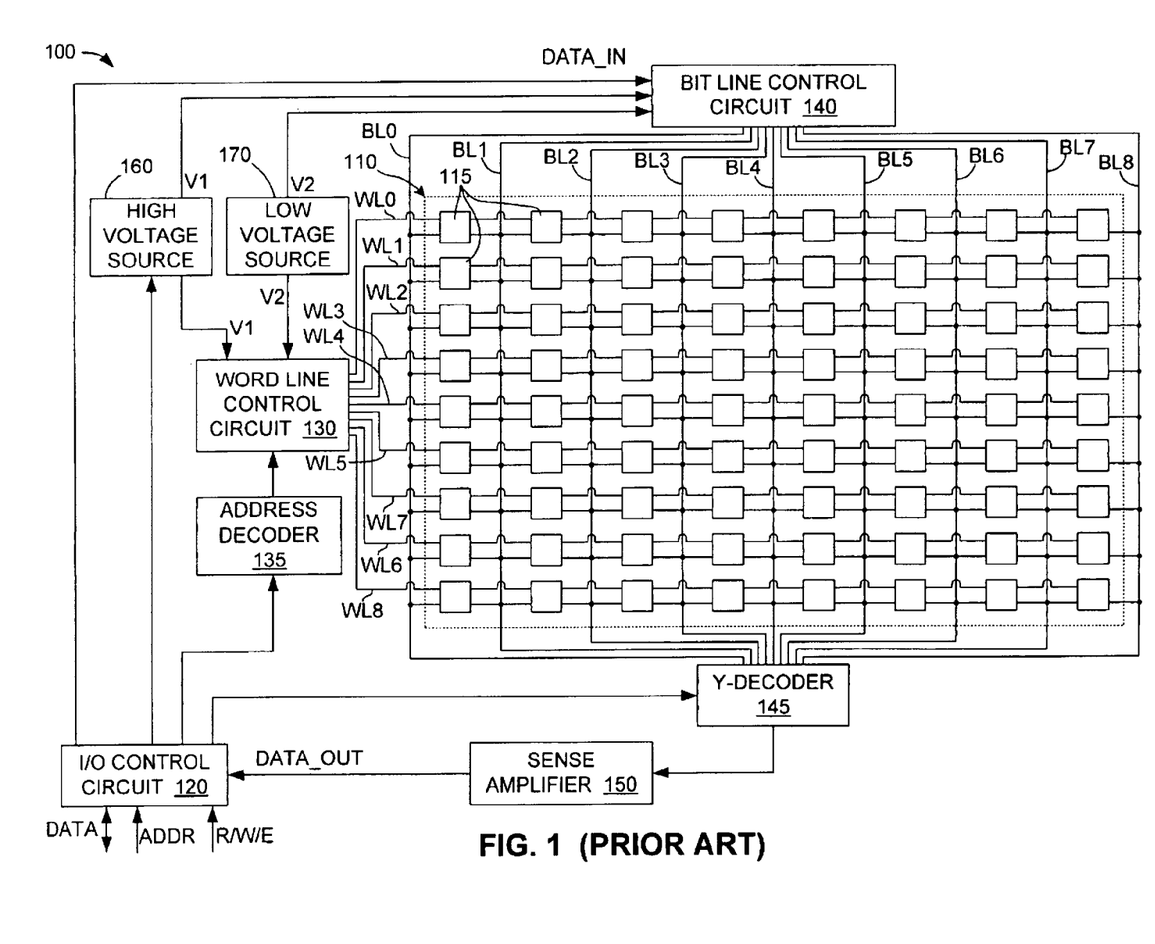
FIG. 1 is a simplified block diagram showing a conventional non-volatile memory device.

FIG. 1 is a simplified block diagram showing a non-volatile memory (NVM) device 100, which represents one type of integrated circuit that utilizes multiple voltage sources. NVM device 100 includes an array 110 of NVM cells 115, and peripheral control circuitry located around array 110 including an input/output (I/O) control circuit 120, a word line control circuit 130, an optional address decoder 135, a bit line control circuit 140, a bit line (Y) decoder 145, and a sense amplifier circuit 150. NVM cells 115 are arranged in rows and columns such that each row of NVM cells 115 is connected to an associated word line WL0 through WL8, and each column of NVM cells 115 is connected to two associated bit lines BL0 through BL8.

Operation of NVM device 100 will now be described in detail with reference to FIG. 1. Data, address (ADDR), and control (R/W/E) signals are transmitted through I/O control circuit 120 during read, write, and erase operations. During write operations, address data and an associated data word are respectively transmitted via I/O control circuit 120 to word line control circuit 130 (via optional address decoder 135) and to bit line control circuit 140. Word line control circuit 130 uses the address data to pass an appropriate programming voltage onto an associated word line (e.g., word line WL0), and bit line control circuit 140 then drives selected bit lines using an appropriate programming voltage to program selected NVM cells 115 of the selected row. According to one convention, the NVM cells 115 that are programmed store a logic "1" data value, and those NVM cells that remain unprogrammed store a logic "0" data value. During subsequent read operations, address data associated with selected data word is transmitted via I/O control circuit 120 to write line driver circuit 130, which uses the address data to apply an appropriate read voltage on the associated word line (e.g., word line WL0), thereby causing the selected data word to be read from the NMV cells onto bit line BL0 through BL7. The thus-read data word is then transmitted via Y-decoder 145 to sense amplifier circuit 150, which in turn passes the selected data word to I/O control circuit 120 for transmission out of NVM device 100. Finally, during erase operations, the word lines and bit lines are maintained at an appropriate voltage level that causes all programmed NVM cells 115 to be erased. Those of ordinary skill in the art will recognize that the above explanation is greatly simplified, and that many variations in the described operations are possible.

Referring to the upper left corner of FIG. 1, in addition to the peripheral control circuitry described above, NVM device 100 includes voltage sources 160 and 170 that respectively generate a first (read) voltage signal V1 and second (program) voltage signal V2, which are transmitted to word line control circuit 130 and bit line control circuit 140. Voltage signals V1 and V2 are selectively passed by these control circuits to the bit lines and word lines in order to facilitate the read and program/erase operations mentioned above.

Figure 2:
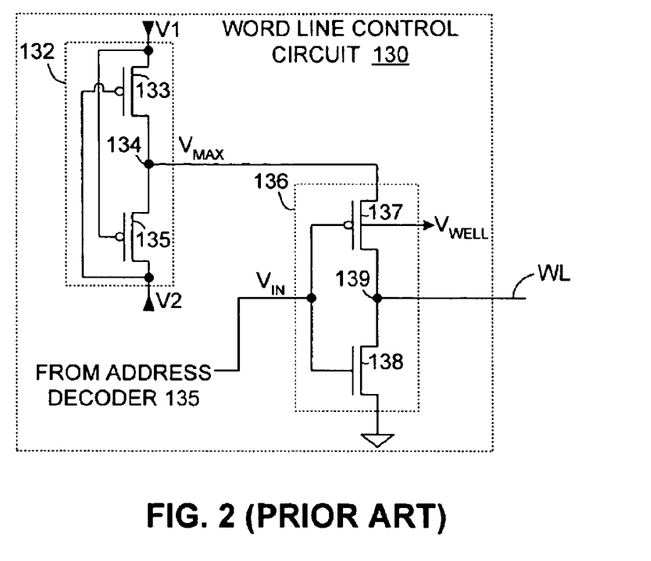
FIG. 2 is a simplified schematic diagram showing a portion of a conventional word line control circuit used in the non-volatile memory device of FIG. 1.

FIG. 2 is a simplified circuit diagram showing a portion of word line control circuit 130 in additional detail. Word line control circuit 130 includes a conventional voltage control circuit 132 and a word line driver 136 that are used in combination to couple an associated word line WL to first voltage signal V1, second voltage signal V2, or ground (i.e., zero Volts). Voltage control circuit 132 includes a first PMOS transistor 133 connected between the first voltage source (i.e., voltage source 160, see FIG. 1) and an output node 134, and a second PMOS transistor 135 connected between the second voltage source (i.e., voltage source 170, see FIG. 1) and output node 134. Note that PMOS transistor 133 is controlled by second voltage signal V2, and PMOS transistor 135 is controlled by first voltage signal V1. Word line driver 136 includes a PMOS transistor 137 and an NMOS transistor 138 that are connected in series between output node 134 of voltage control circuit 132 and ground. PMOS transistor 137 and NMOS transistor 138 are controlled by a word line control signal VIN. During operation, voltage control circuit 132 passes a maximum voltage $V_{MAX}$, which is the greater (i.e., most positive voltage) of first voltage signal V1 and second voltage signal V2, to driver 136, which in turn applies either $V_{MAX}$ or ground onto word line WL in accordance with word line control signal $V_{IN}$.

A problem with conventional voltage control circuit 132 arises when voltage signals V1 and V2 are within one threshold voltage of each other. In particular, referring to FIG. 2, when voltage signals V1 and V2 vary by less than one threshold voltage of PMOS transistors 133 and 135, then both of these transistors remain turned off and output node 134 remains floating, thereby potentially causing a latch up condition, and possibly causing damage to NVM device 100 by coupling voltage sources 160 and 170 together. This problem arises, for example, when voltage signals V1 and V2 are asynchronously changed between relatively low voltages used to perform read operations, and relatively high voltages utilized during program/erase operations. That is, when voltage supply 160 changes voltage signal V1 between a read voltage level and a program voltage level, depending upon the current operation, and voltage supply 170 similarly changes voltage signal V2 between a read voltage level and a program voltage level, and voltage supplies 160 and 170 operate asynchronously, then several situations can arise in which these voltage signals are within one threshold voltage of each other, as set forth in the following example.

Figure 3:
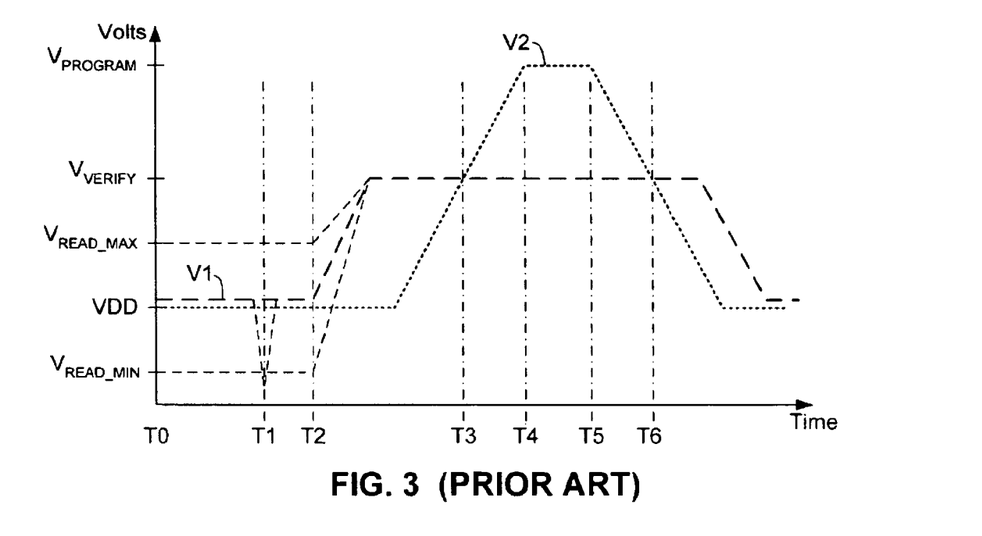
FIG. 3 is a timing diagram showing an example of two voltage signals generated by asynchronous voltage sources in the non-volatile memory device of FIG. 1.

FIG. 3 is a timing diagram showing exemplary voltage signals V1 and V2 that produce the problem mentioned above. In particular, FIG. 3 shows voltage signals V1 and V2 during a read (normal) operation (e.g., time T0 through T2) and a subsequent program operation. During read operations, voltage signal V1 is selectively adjustable (trimmable) by a user/manufacturer to be within a voltage range between a maximum value $V_{READ\_MAX}$ (e.g., system voltage VDD plus one Volt) and a minimum value $V_{READ\_MIN}$ (e.g., system voltage VDD minus one Volt). At the same time, voltage V2 is maintained at system voltage VDD. That is, depending on how V1 is trimmed, during read operations voltage signal V1 may be higher or lower than voltage signal V2. Conversely, during program operations (e.g., time T2 through T5), voltage signal V1 is raised to a program verify voltage $V_{VERIFY}$ (e.g., VDD plus two or more Volts), and voltage V2 is raised to a program voltage $V_{PROGRAM}$ (e.g., 10 Volts). Of course, during a subsequent read operation, voltage signals V1 and V2 return to their previous read levels, as indicated after time T5. As described above, voltage signals V1 and V2 are selectively utilized by bit line control circuit 140 to control the bit lines BL0–BL8 of NVM device 100, and are transmitted to conventional voltage control circuit 132 of word line control circuit 130 (see FIG. 2).

In the example indicated by the timing diagram in FIG. 3, there are several situations in which first voltage signal V1 and second voltage signal V2 "cross over" (i.e., signal V1 changes from being lower than signal V2 to being higher than signal V2, or vice versa) or are otherwise within one threshold voltage of each other, which can cause PMOS transistors 133 and 135 of conventional voltage control circuit 132 (see FIG. 2) to erroneously turn off. First, voltage signal V1 may be erroneously trimmed to a read level that is within one threshold voltage of VDD (i.e., the read level of voltage signal V2). Second, as indicated at time T1, read cycle charging of an associated word line using voltage signal V1 can cause a temporary drop in voltage signal V1, thereby causing voltage signal V1 to temporarily equal voltage signal V2. Third, during the transition between a read operation and a program operation (time T2 to T4), a cross-over occurs at a time T3 when voltage signal V1 reaches the program verify voltage $V_{VERIFY}$ before voltage signal V2 reaches the program voltage $V_{PROGRAM}$. Similarly, during a subsequent transition from the program voltage levels to the read voltage levels (time T5 on), a cross-over can occur at a time T6 when voltage signal V2 drops below the program verify voltage $V_{VERIFY}$ before voltage signal V1 drops back to its read level.

What is needed is a voltage control circuit for integrated circuits utilizing asynchronous voltage sources that avoids the problems (described above) that are associated with conventional integrated circuits.

SUMMARY OF THE INVENTION

The present invention is directed to a voltage control circuit for a non-volatile memory (NVM) array (or other integrated circuit) that couples an output node to the greater of two voltage signals, wherein the voltage control circuit utilizes the gain generated by a comparator circuit to control the coupling process such that the voltage difference needed to switch between the first and second voltage signals is minimized. Specifically, the comparator circuit is constructed to provide an output gain such that a relatively small difference between the first and second voltage signals causes the comparator output signal to switch between a maximum (high) voltage level and a minimum (low) voltage level (e.g., ground). The high or low comparator output signal is transmitted to a switch control circuit, which controls a pair of switches to couple one of the first and second voltage sources to the output node according to the comparator output signal level. Accordingly, the voltage control circuit of the present invention minimizes the range in which small differences between asynchronous voltage sources produce floating output signals, thereby improving the performance of the NVM device and preventing latch-up and coupling of the voltage sources.

In accordance with a specific embodiment of the present invention, the comparator circuit includes a four PMOS transistors respectively connected in series with four NMOS transistors between the two voltage sources and ground. In particular, a first PMOS transistor is connected between the first voltage source and a first NMOS transistor, a second PMOS transistor is connected between the second voltage source and a second NMOS transistor, a third PMOS transistor is connected between the first voltage source and a third NMOS transistor, and a fourth PMOS transistor is connected between the second voltage source and a fourth NMOS transistor. The first and second NMOS transistors are controlled by a bias signal, which is selected to produce a first current through the first PMOS transistor and the first NMOS transistor, and a second current through the second PMOS transistor and the second NMOS transistor. The first and fourth PMOS transistors are connected to a node located between the first PMOS and first NMOS transistors, and the second and third PMOS transistors are connected to a node located between the second PMOS and second NMOS transistors. Finally, the third and fourth NMOS transistors are connected to a node located between the third PMOS and third NMOS transistors. An output node located between the fourth PMOS transistor and the fourth NMOS transistor is connected to an input terminal of the switch control circuit. The switch control circuit includes a pair of series connected inverters and level shifters for controlling the first and second PMOS switches. With this arrangement, when the first voltage signal is greater than the second voltage signal by even a small amount (i.e., significantly less than the threshold voltage of a transistor), the current through the fourth PMOS transistor becomes less than the current through the fourth NMOS transistor, and the output node VOUT is pulled to ground. Conversely, when the first voltage signal is less than the second voltage signal by the small amount, then the current through the fourth PMOS transistor becomes greater than the current through the fourth NMOS transistor, and the output node VOUT is pulled up to the second voltage signal. Accordingly, the voltage control circuit of the present invention avoids the wide voltage range that produces the floating output signal in conventional voltage control circuits.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is described below with reference to specific examples in which the invention is incorporated into a non-volatile memory (NVM) device, such as a "flash" EPROM device. In the following description, elements of the NVM device that are similar to those used in convention NVM device 100 (described above) are identified with the same reference numbers. While the present invention is particularly useful in NVM devices, such as the device described below, similar benefits may also provided when the present invention is incorporated into other integrated circuits including asynchronous voltage sources.

Figure 4:
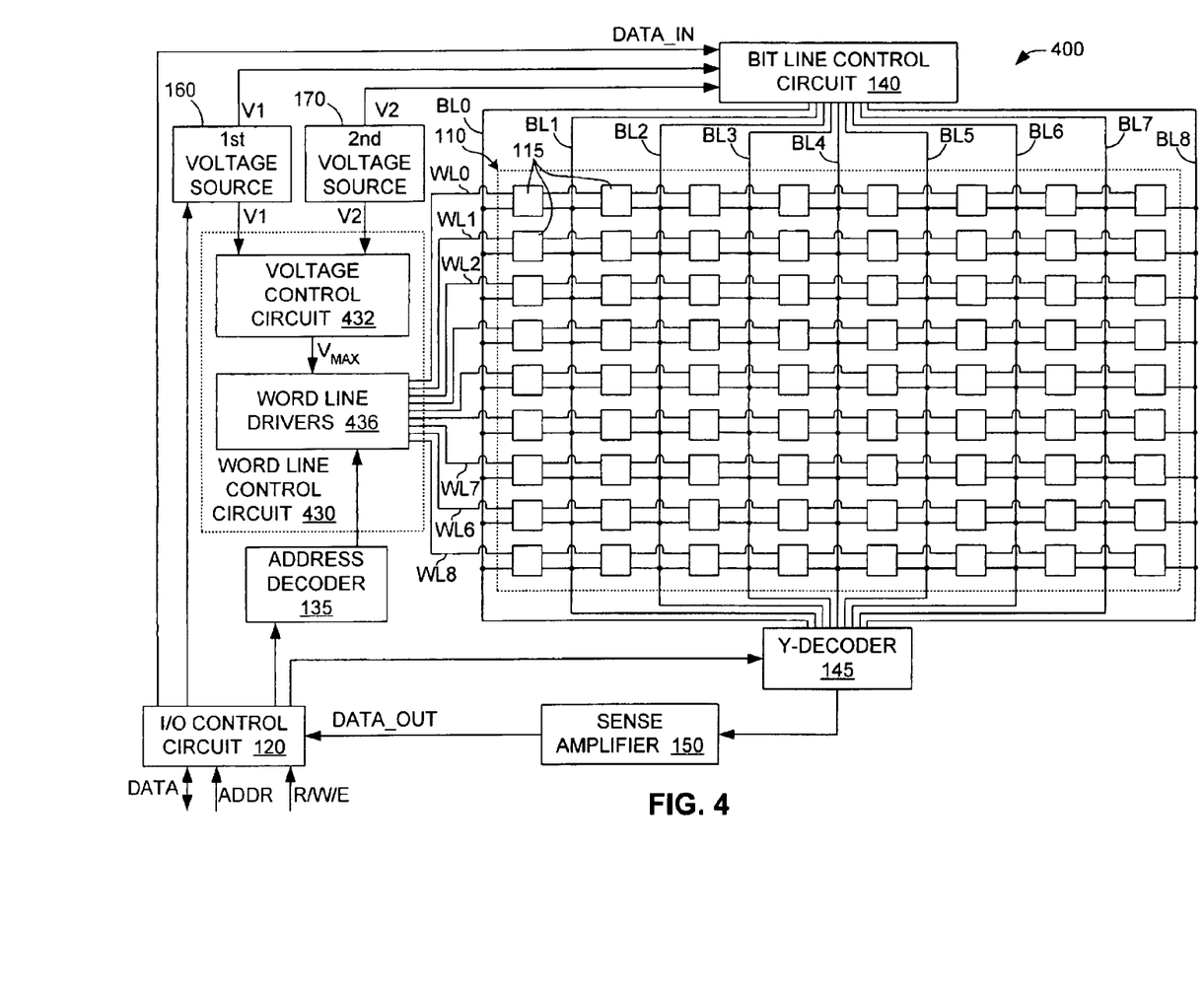
FIG. 4 is a simplified block diagram showing a non-volatile memory device including a voltage control circuit according to the present invention.

FIG. 4 is a simplified block diagram showing a non-volatile memory (NVM) device 400 according to an embodiment of the present invention. Similar to conventional NVM device 100 (described above), NVM device 400 includes an array 110 of NVM cells 115, and peripheral control circuitry located around array 110 including an input/output (I/O) control circuit 120, a word line control circuit 430 and associated address decoder 135, a bit line control circuit 140 and associated bit line (Y) decoder 145, and a sense amplifier circuit 150. Flash memory cells 115 are arranged in rows and columns such that each row of memory cells 115 is connected to an associated word line WL0 through WL8, and each column of memory cells 115 is connected to two associated bit lines BL0 through BL8. Data, address (ADDR), and control (R/W/E) signals are transmitted through I/O control circuit 120 during read, write, and erase operations. These operations are essentially identical to those described above with reference to conventional NVM device 100, and their description is omitted here for brevity.

Referring to the left side of FIG. 4, word line control circuit 430 includes a voltage control circuit 432 and a set of word line driver circuits 436. Similar to conventional voltage control circuit 132, voltage control circuit 432 passes a maximum voltage $V_{MAX}$, which is the greater of a first voltage signal V1 generated by first voltage source 160 and a second voltage signal V2 generated by second voltage source 170, to word line driver circuit 436. Word line driver 436 includes several word line drivers that operate in the manner described below to apply either maximum voltage $V_{MAX}$ or ground (e.g., 0 Volts) to an associated word line WL0 through WL8.

Figure 5:
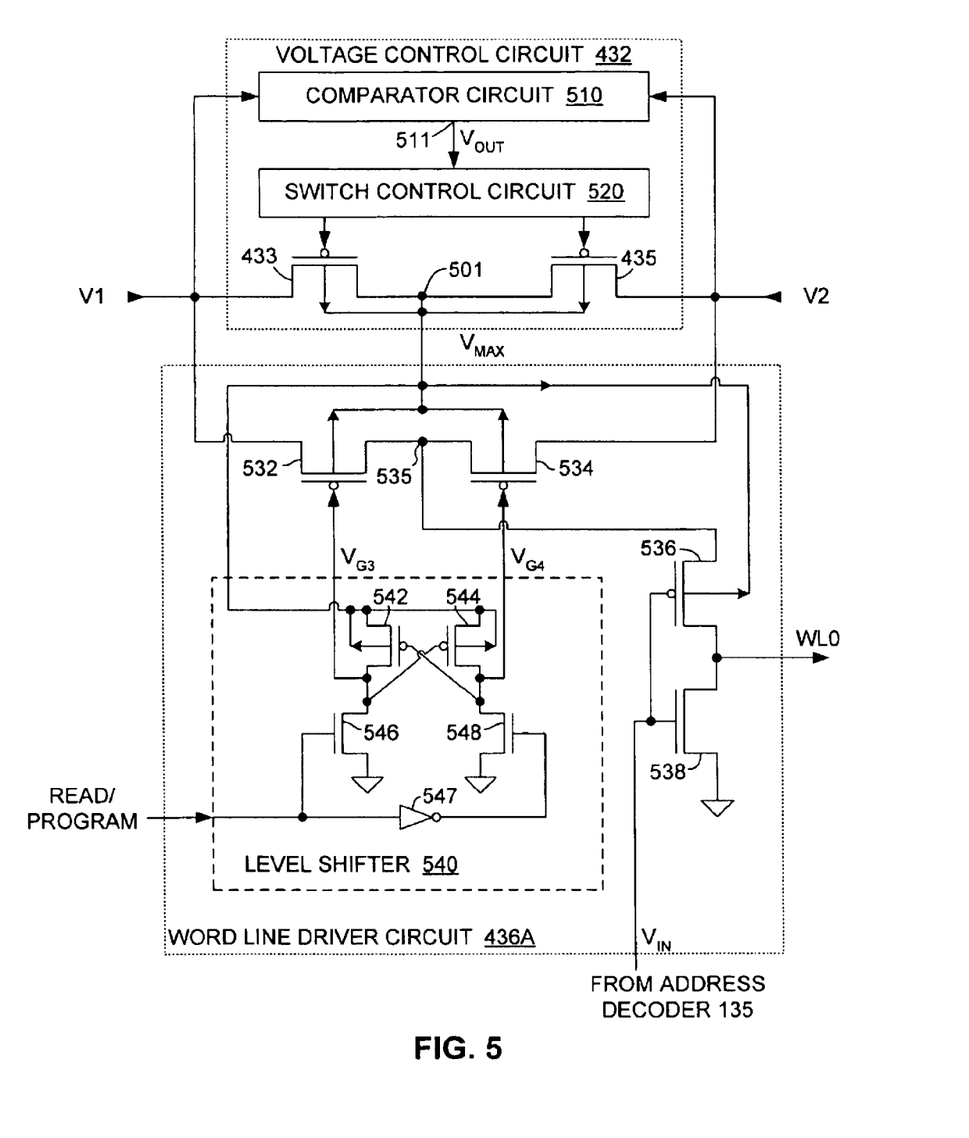
FIG. 5 is a block diagram showing a voltage control circuit according to a simplified embodiment of the present invention.

FIG. 5 is a block diagram showing voltage control circuit 432 and an exemplary word line driver circuit 436A that drives associated word line WL0 according to a simplified embodiment.

Referring to the upper portion of FIG. 5, voltage control circuit 432 includes a first PMOS switch 433, a second PMOS switch 435, a comparator circuit 510, and a switch control circuit 520. First switch 433 is connected between first voltage source 160 (see FIG. 4) and an output node 501, through which maximum voltage $V_{MAX}$ to word line driver circuit 146. Similarly, second switch 433 is connected between second voltage source 170 (see FIG. 4) and output node 501. Comparator circuit 510 has a first input terminal connected to first voltage source 160, a second input terminal connected to second voltage source 170, and an output terminal 511 through which a comparator output signal $V_{OUT}$ is transmitted to switch control circuit 520. Switch control circuit 520 has a first input terminal connected to output terminal 511 of comparator circuit, a first output terminal connected to a gate terminal of first switch 433, and a second output terminal connected to a gate terminal of second switch 435. In accordance with an aspect of the present invention, comparator circuit 510 generates a low (first) output signal VOUT when first voltage V1 is greater than second voltage V2, and generates a high (second) output signal $V_{OUT}$ when second voltage V2 is greater than first voltage V1. When comparator circuit 510 transmits a low output signal VOUT to switch control circuit 520, switch control circuit 520 turns on first switch 433 and turns off second switch 435, thereby coupling output node 501 to first voltage source 160 (i.e., such that maximum voltage $V_{MAX}$ is equal to first voltage V1). Conversely, when comparator circuit 510 transmits a high output signal $V_{OUT}$ to switch control circuit 520, switch control circuit 520 turns off first switch 433 and turns on second switch 435, thereby coupling output node 501 to second voltage source 170 (i.e., such that maximum voltage $V_{MAX}$ is equal to second voltage V2).

Referring to the lower portion of FIG. 5, word line driver circuit 436A includes a first PMOS switch 532, a second PMOS switch 534, a third PMOS switch 536, an NMOS switch 538, and a level shifter 540. First PMOS switch 532 has a first terminal connected to receive first voltage signal V1, a second terminal connected to a node 535, a bulk (body) connected to maximum voltage $V_{MAX}$, and a gate controlled by a first gate voltage $V_{G3}$ generated by level shifter 540. Second PMOS switch 534 has a first terminal connected to receive second voltage signal V2, a second terminal connected to node 535, a bulk (body) connected to maximum voltage $V_{MAX}$, and a gate controlled by a second gate voltage $V_{G4}$ generated by level shifter 540. Third PMOS transistor 536 has its first terminal connected to node 535, a second terminal connected to associated word line WL0, a bulk (body) connected to maximum voltage $V_{MAX}$, and a gate terminal connected to receive a word line control signal $V_{IN}$ from address decoder 135 (see FIG. 4). NMOS transistor 538 has a first terminal connected to associated word line WL0, a second terminal connected to ground, and a gate terminal connected to receive word line control signal $V_{IN}$. Level shifter 540 includes a first PMOS transistor 542, a second PMOS transistor 544, a first NMOS transistor 546, an inverter 547, and a second NMOS transistor 548. First NMOS transistor 542 has a first terminal and body connected to receive maximum voltage $V_{MAX}$, and a second terminal connected to a first terminal of NMOS transistor 546 and to the gate terminals of PMOS transistors 532 and 544. Second NMOS transistor 544 has a first terminal and body connected to receive maximum voltage $V_{MAX}$, a second terminal connected to a first terminal of NMOS transistor 548 and to the gate terminals of PMOS transistors 532 and 544. NMOS transistors 546 and 548 are respectively connected between PMOS transistors 542 and 544 and ground. A read/program mode control signal transmitted from an external control circuit (e.g., I/O control circuit 120; see FIG. 4) is transmitted to the gate terminal of NMOS transistor 546, and is also inverted by inverter 547 and applied to the gate terminal of NMOS transistor 548.

Figure 6:
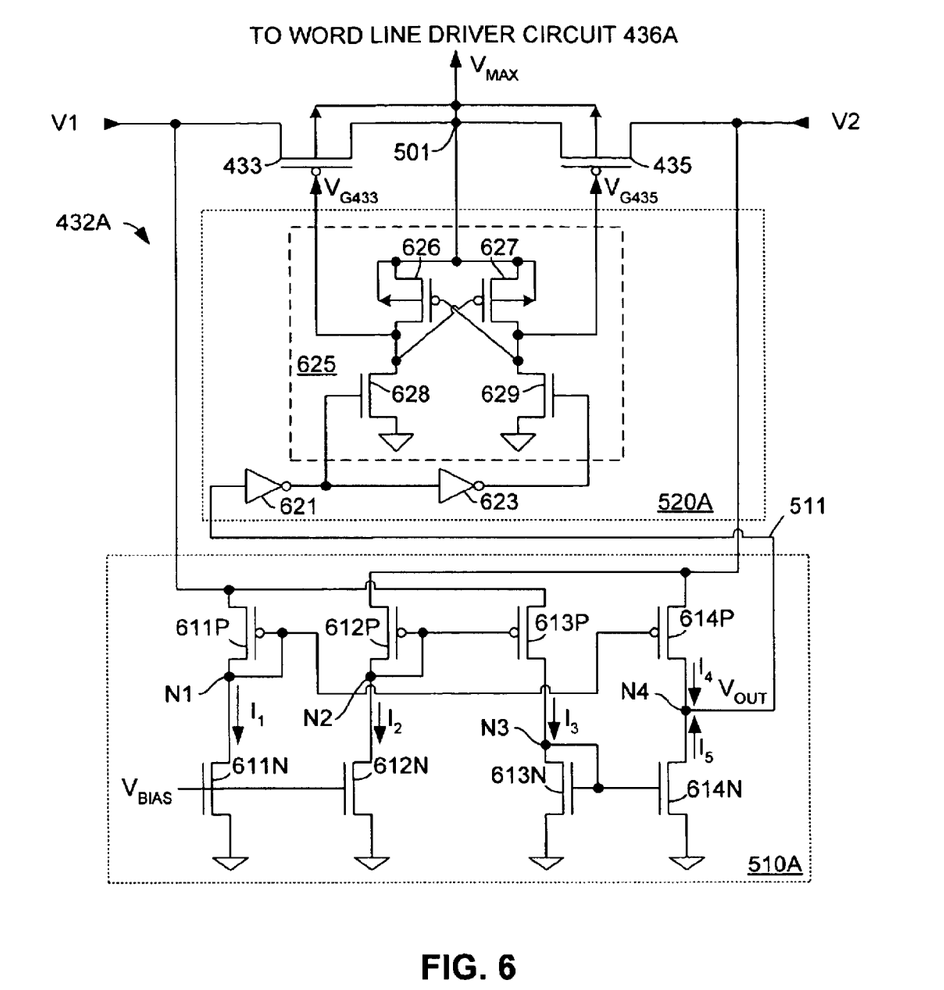
FIG. 6 is a simplified schematic diagram showing a voltage control circuit according to a specific embodiment of the present invention.

FIG. 6 is a schematic diagram showing a voltage control circuit 432A including a comparator circuit 510A and switch control circuit 520A according to a specific embodiment of the present invention.

Referring to the lower portion of FIG. 6, comparator circuit 510A includes four PMOS transistors 611P through 614P respectively connected in series with four NMOS transistors 611N through 614N between voltage sources 160/170 and ground. In particular, a first PMOS transistor 611P is connected between first voltage signal V1 and a first NMOS transistor 611N, a second PMOS transistor 612P is connected between second voltage signal V2 and a second NMOS transistor 612N, a third PMOS transistor 613P is connected between first voltage signal V1 and a third NMOS transistor 613N, and a fourth PMOS transistor 614P is connected between second voltage signal V2 and a fourth NMOS transistor 614N. A first node N1 is defined between first PMOS transistor 611P and first NMOS transistor 611N, a second node N2 is defined between second PMOS transistor 612P and second NMOS transistor 612N, a third node N3 is defined between third PMOS transistor 613P and third NMOS transistor 613N, and a fourth node N4 is defined between fourth PMOS transistor 614P and fourth NMOS transistor 614N. The gate terminal of first PMOS transistor 611P and the gate terminal of fourth PMOS transistor 614P are connected to first node N1, and the gate terminal of second PMOS transistor 612P and third PMOS transistor 613P are connected to second node N2. First and second NMOS transistors 611N and 612N are controlled by a bias source $V_{BIAS}$, which is selected to produce a first current $I_1$ through first PMOS transistor 611P and the first NMOS transistor 611N (i.e., through first node N1), and a second current $I_2$ through second PMOS transistor 612P and second NMOS transistor 612N (i.e., through second node N2). Finally, the gate terminals of third NMOS transistor 613N and fourth NMOS transistor 614N are connected to third node N3. Output node 511 is connected to fourth node N4. With this arrangement, when first voltage signal V1 is greater than the second voltage signal V2, a current 14 through fourth PMOS transistor 614P becomes less than a current 15 through fourth NMOS transistor 614N, thereby causing output node $V_{OUT}$ to be pulled to ground through fourth NMOS transistor 614N. Conversely, when first voltage signal V1 is less than second voltage signal V2, then current 14 through fourth PMOS transistor 614P becomes greater than current 15 through fourth NMOS transistor 614N, and output node $V_{OUT}$ is pulled up to the second voltage signal V2.

According to another aspect of the present invention, the output gain of comparator circuit 510A is set such that a relatively small difference between first voltage signal V1 and second voltage signal V2 results in a maximum output voltage $V_{OUT}$ (i.e., either V2 or ground).

This output gain is expressed as $$\text{Gain} = V_{OUT}/V_{12} \tag{1}$$

where $V_{12}$ is the absolute value of the difference between first voltage signal V1 and second voltage signal V2. This output gain can also be expressed as $$\text{Gain} = \frac{2g_m}{g_{sdn} + g_{sdp}} = \frac{2\sqrt{2I_5 KW/L}}{1/\lambda_p I_4 + 1/\lambda_n I_5} \tag{2}$$

where $g_m$ and $g_{sdn}$ are the conductances of fourth NMOS transistor 614N, $g_{sdp}$ is the channel conductance of fourth PMOS transistor 614P, $\lambda_p$ is the channel length modulation parameter for fourth PMOS transistor 614P, $\lambda_n$ is the channel length modulation parameter for fourth NMOS transistor 614N, K is a process constant equal to the zero field mobility $\mu_0$ times the gate capacitance $C_{OX}$ of fourth NMOS transistor 614N, and W/L is the size (width/length) of fourth NMOS transistor 614N. In one example using a 0.5 micron CMOS process, exemplary values K=25 $\mu$A/V, W=5 $\mu$m, L=1 $\mu$m, $\lambda_p$=0.01, and $\lambda_n$=0.01 produced a gain of 500. Accordingly, comparator circuit 510A produces a maximum output voltage $V_{OUT}$ (i.e., either V2 of ground) in response to differences between V1 and V2 as small as 10 mV.

Referring again to FIG. 6, switch control circuit 520A includes a first inverter 621, a second inverter 623, and a level shifter 625. The input terminal of inverter 621 is connected to output terminal 511 of comparator circuit 510A, and the input terminal of inverter 623 is connected to the output terminal of inverter 621. Level shifter 625 has a first input terminal connected to the output terminal of inverter 621, and a second input terminal connected to output node 501. Level shifter 625 includes a first PMOS transistor 626, a second PMOS transistor 627, a first NMOS transistor 628, and a second NMOS transistor 629. First NMOS transistor 626 has a first terminal and body connected to output node 501, and a second terminal connected to a first terminal of NMOS transistor 628 and to the gate terminals of PMOS transistors 433 and 627. Second NMOS transistor 627 has a first terminal and body connected to output node 501, a second terminal connected to a first terminal of NMOS transistor 629 and to the gate terminals of PMOS transistors 435 and 626. NMOS transistors 628 and 629 are connected between ground and PMOS transistors 626 and 627, respectively. Comparator output signal $V_{OUT}$, which is transmitted from comparator circuit 510A, is inverted by inverter 621 and transmitted to the gate terminal of NMOS transistor 628, and is also re-inverted by inverter 623 and applied to the gate terminal of NMOS transistor 629.

Figure 7A:
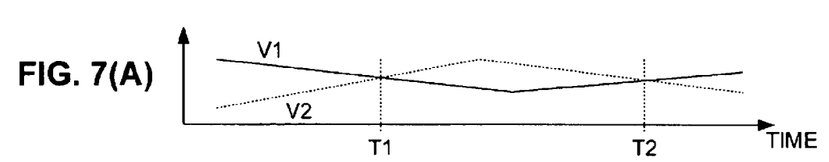
FIGS. 7(A), 7(B), 7(C), 7(D), and 7(E) are exemplary timing diagrams showing various voltage signals of the voltage control circuit of FIG. 6.
Figure 7B:
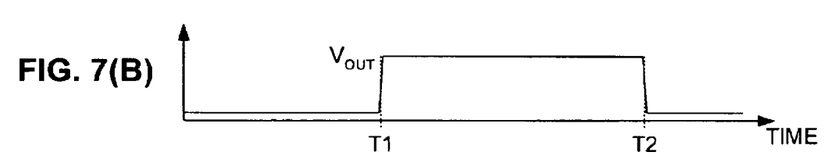
Figure 7C:
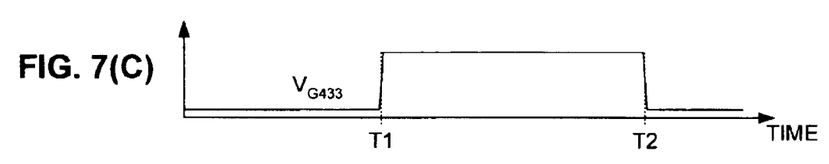
Figure 7D:
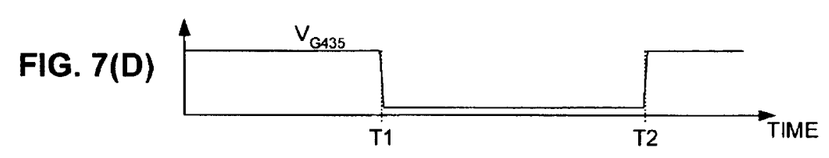
Figure 7E:
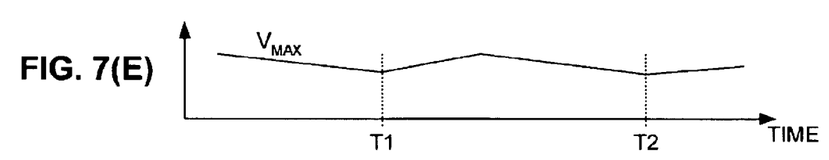

FIGS. 7(A) through 7(E) are timing diagrams illustrating an exemplary operating sequence of voltage control circuit 432A. FIG. 7(A) shows voltage signals V1 and V2 in a time period during which voltage signal V1 is greater than voltage signal V2 up to a time T1, voltage signal V2 is greater than voltage signal V1 between time T1 and a time T2, and thereafter voltage signal V1 is greater than voltage signal V2. As shown in FIG. 7(B) and as discussed above, while voltage signal V1 is greater than voltage signal V2, comparator output voltage $V_{OUT}$ is low, thereby causing inverter 621 to transmit a high output signal to NMOS transistor 628 of level shifter 625, and in turn causing inverter 623 to transmit a low output signal to NMOS transistor 629 of level shifter 625. Under these conditions, as shown in FIGS. 7(C) and 7(D), level shifter 625 generates a low (i.e., ground) gate voltage $V_{G433}$ that turns on switch 433, and a high (i.e., $V_{MAX}$) gate voltage $V_{G435}$ that reliably turns off switch 435, thereby coupling output node 501 to first voltage source 160 (i.e., as indicated in FIG. 7(E), maximum voltage $V_{MAX}$ tracks first voltage signal V1). Subsequently, at time T1, voltage signal V2 exceeds voltage signal V1, thereby causing comparator circuit 510A to generate a high output signal $V_{OUT}$ (see FIG. 7(B)) that causes inverter 621 to transmit a low (ground) output signal to NMOS transistor 628 of level shifter 625, and causes inverter 623 to transmit a high ($V_{MAX}$) output signal to NMOS transistor 629 of level shifter 625. Under these conditions, as shown in FIGS. 7(C) and 7(D), level shifter 625 generates a high gate voltage $V_{G433}$ that turns off switch 433, and a low gate voltage $V_{G435}$ that turns on switch 435, thereby coupling output node 501 to second voltage source 170 (i.e., as indicated in FIG. 7(E), maximum voltage $V_{MAX}$ tracks second voltage signal V2). Finally, at time T2, voltage signal V2 again drops below voltage signal V1, thereby causing comparator circuit 510A to again generate a low output signal $V_{OUT}$ (see FIG. 7(B)), resulting in a low gate voltage $V_{G433}$ that turns on switch 433, and a high gate voltage $V_{G435}$ that turns on switch 435, thereby coupling output node 501 to first voltage source 160.

Referring again to FIG. 5, word line driver circuit 436A receives maximum voltage $V_{MAX}$ along with voltage signals V1 and V2. Mode control signal READ/PROGRAM is asserted (high) during read operations, which turns on NMOS transistor 546 and turns off NMOS transistor 548 of level shifter 540. The low (ground) voltage level at the first terminal of NMOS transistor 546 turns on PMOS transistors 532 and 544, thereby passing first voltage signal V1 to the first (upper) terminal of PMOS transistor 536. The high ($V_{MAX}$) voltage level at the first terminal of NMOS transistor 548 turns off PMOS transistors 542 and 534, thereby isolating second voltage signal V2 and preventing latch-up or damage. That is, because maximum voltage $V_{MAX}$ is applied to the gate terminals of PMOS transistors 542 and 534, these transistors are reliably turned off, thereby reliably preventing the coupling of voltage signals V1 and V2, which can result in damage to voltage sources 160 and 170 (see FIG. 4). Subsequently, when associated word line WL0 is selected for a read operation, word line control signal VIN is de-asserted (low) to turn on PMOS transistor 536 such that voltage signal V1 is transmitted onto associated word line WL0. Similarly, during program/erase operations, mode control signal READ/PROGRAM is de-asserted (low), which turns off NMOS transistor 546 and turns on NMOS transistor 548 of level shifter 540. The low (ground) voltage level at the first terminal of NMOS transistor 548 turns on PMOS transistors 534 and 542, thereby passing second voltage signal V2 to the first (upper) terminal of PMOS transistor 536. The high ($V_{MAX}$) voltage level at the first terminal of NMOS transistor 546 turns off PMOS transistors 544 and 532, thereby isolating first voltage signal V1 from second voltage source V2. Subsequently, when associated word line WL0 is selected for a read operation, word line control signal VIN is de-asserted (low) to turn on PMOS transistor 536 such that voltage signal V2 is transmitted onto associated word line WL0. Note that, when associated word line WL0 is not selected, word line control signal VIN is asserted (high) to turn on NMOS transistor 538, thereby coupling associated word line WLO to ground.

Although the present invention has been described with respect to certain specific embodiments, it will be clear to those skilled in the art that the inventive features of the present invention are applicable to other embodiments as well, all of which are intended to fall within the scope of the present invention. For example, as mentioned above, those of ordinary skill in the art will recognize that alternative circuits may be utilized in place of the specific circuit arrangement described above with reference to FIG. 6 to produce the beneficial switch control described herein. Thus, the invention is limited only by the following claims.

What is claimed is:

1. A voltage control circuit for pausing the greater or a first voltage signal and a second voltage signal to an output node, wherein the first and second voltage signals are respectively generated by a first voltage source and a second voltage source, the voltage control circuit comprising:
   a first switch connected between the first voltage source and the output node;
   a second switch connected between the second voltage source and the output node;
   a comparator circuit having a first input terminal connected to the first voltage source, a second input terminal connected to the second voltage source, and an output terminal; and
   a switch control circuit having a first input terminal connected to the output terminal of the comparator circuit, a first output terminal connected to a gate terminal of the first switch, and a second output terminal connected to a gate terminal of the second switch,
   wherein the comparator circuit generates a first output signal when the first voltage is greater than the second voltage, and generates a second output signal when the second voltage is greater than the first voltage,
   wherein, when the comparator circuit generates the first output signal, the switch control circuit turns on the first switch and turns off the second switch, thereby coupling the output node to the first voltage source, and
   wherein, when the comparator circuit generates the second output signal, the switch control circuit turns on the second switch and turns off the first switch, thereby coupling the output node to the second voltage source.

2. The voltage control circuit according to claim 1, wherein the first switch and the second switch comprise PMOS transistors.

3. The voltage control circuit according to claim 1, wherein bulks of the first and second switches are connected to the output nods.

4. The voltage control circuit according to claim 1, wherein the comparator circuit comprises:

a first PMOS transistor having a first terminal connected to the first voltage source, and a second terminal,
a first NMOS transistor having a first terminal connected to the second terminal of the first PMOS transistor, and a second terminal connected to ground,
a second PMOS transistor having a first terminal connected to the second voltage source, and a second terminal,
a second NMOS transistor having a first terminal connected to the second terminal of the second PMOS transistor, and a second terminal connected to ground;
a third PMOS transistor having a first terminal connected to the first voltage source, and a second terminal;
a third NMOS transistor having a first terminal connected to the second terminal of the third PMOS transistor, and a second terminal connected to ground;
a fourth PMOS transistor having a first terminal connected to the second voltage source, and a second terminal; and
a fourth NMOS transistor having a first terminal connected to the second terminal of the fourth PMOS transistor, and a second terminal connected to ground;
wherein a gate of the first PMOS transistor is connected to the second terminal of tire first PMOS transistor, and to a gate terminal of the fourth PMOS transistor,
wherein a gate of the second PMOS transistor is connected to the second terminal of the second PMOS transistor, and to a gate terminal of the third PMOS transistor,
wherein a gate of the third PMOS transistor is connected to the first terminal of the third NMOS transistor, and to a gate terminal of the fourth NMOS translator, and
wherein the first and second output signals are generated at an output terminal located between the fourth PMOS transistor and the fourth NMOS transistor.

5. The voltage control circuit according to claim 1, wherein the switch control circuit comprises:
   a first inverter connected to the first input terminal;
   a second inverter connected to an output terminal of the first inverter; and
   a level shifter circuit having a first input terminal connected to the output terminal of the first inverter, a second input terminal connected to an output terminal of the second inverter, a third input terminal connected to the output node,
   wherein the level shifter generates a first gate control voltage that is transmitted via the first output terminal to the gate terminal of the first switch, and the level shifter generates a second gate control voltage that is transmitted via the second output terminal to the gate terminal of the second switch.

6. The voltage control circuit according to claim 5, wherein the level shifter comprises:
   a first PMOS transistor having a f±rat terminal connected to the output node, and a second terminal connected to the gate terminal of the first switch;
   a second PMOS transistor having a first terminal connected to the output node, and a second terminal connected to the gate terminal of the second switch;
   a first NMOS transistor having a first terminal connected to the second terminal of the first PMOS transistor, a second terminal connected to ground, end a gate terminal connected to the output terminal of the first inverter; and a second NMOS transistor having a first terminal connected to the second terminal of the second PMOS transistor, a second terminal connected to ground, and a gate terminal connected to the output terminal of the second inverter, wherein a gate terminal of the first PMOS transistor is connected to the second terminal of the second PMOS transistor, and wherein a gate terminal of the second PMOS transistor is connected to the second terminal of the first PMOS transistor.

7. An integrated circuit device comprising:

a first voltage source for generating a first voltage;

a second voltage source for generating a second voltage; and a voltage control circuit for passing the greater of the first voltage signal and the second voltage signal to an output node, wherein the voltage control circuit includes:

a first switch connected between the first voltage source and the output node;

a second switch connected between the second voltage source and the output node;

a comparator circuit having a first input terminal connected to the first voltage source, a second input terminal connected to the second voltage source, and an output terminal; and a switch control circuit having a first input terminal connected to the output terminal of the comparator circuit, a first output terminal connected to a gate terminal of the first switch, and a second output terminal connected to a gate terminal of the second switch, wherein the comparator circuit generates a first output signal then the first voltage is greater than the second voltage, and generates a second output signal when the second voltage is greater than the first voltage, wherein, when the comparator circuit generates the first output signal, the switch control circuit turns on the first switch and turns off the second switch, thereby coupling the output node to the first voltage source, and wherein, when the comparator circuit generates the second output signal, the switch control circuit turns on the second switch and turns off the first switch, thereby coupling the output node to the second voltage source.

8. The integrated circuit device according to claim 7, wherein the first switch and the second switch comprise PMOS translators.

9. The integrated circuit device according to claim 7, wherein bulks of the first and second switches are connected to the output node.

10. The integrated circuit device according to claim 7, wherein the comparator circuit comprises:

a first PMOS transistor having a first terminal connected to the first voltage source, end a second terminal;

a first NMOS transistor having a first terminal connected to the second terminal of the first PMOS transistor, and a second terminal connected to ground;

a second PMOS transistor having a first terminal connected to the second voltage source, and a second terminal;

a second NMOS transistor having a first terminal connected to the second terminal of the second PMOS transistor, and a second terminal connected to ground;

a third PMOS transistor having a first terminal connected to the first voltage source, and a second terminal;

a third NMOS transistor having a first terminal connected to the second terminal of the third PMOS transistor, and a second terminal connected to ground;

a fourth PMOS transistor having a first terminal connected to the second voltage source and a second terminal; and a fourth NMOS transistor having a first terminal connected to the second terminal of the fourth PMOS transistor, and a second terminal connected to ground;

wherein a gate of the first PMOS transistor is connected to the second terminal of the first PMOS transistor, and to a gate terminal of the fourth PMOS transistor, wherein a gate of the second PMOS transistor is connected to the second terminal of the second PMOS transistor, and to a gate terminal of the third PMOS transistor, wherein a gate of the third NMOS transistor is connected to the first terminal of the third NMOS transistor, and to a gate terminal at the fourth NMOS transistor, and wherein the first and second output signals are generated at an output terminal located between the fourth PMOS transistor and the fourth NMOS transistor.

11. The integrates circuit device according to claim 7, wherein the switch control circuit comprises:

a first inverter connected to the first input terminal;

a second inverter connected to an output terminal of the first inverter; and a level shifter circuit having a first input terminal connected to the output terminal of the first inverter, a second input terminal connected to an output terminal of the second inverter, a third input terminal connected to the output node, wherein the level shifter generates a first gate control voltage that is transmitted via the first output terminal to the gate terminal of the first switch, and the level shifter generates a second gate control voltage that is transmitted via the second output terminal to the gate terminal of the second switch.

12. The integrated circuit device according to claim 11, wherein the level shifter comprises:

a first PMOS transistor having a first terminal connected to the output node, and a second terminal connected to the gate terminal of the first switch;

a second PMOS transistor having a first terminal connected to the output node, and a second terminal connected to the gate terminal of the second switch;

a first NMOS transistor having a first terminal connected to the second terminal of the first PMOS transistor, a second terminal connected to ground, and a gate terminal connected to the output terminal of the first inverter; and a second PMOS transistor having a first terminal connected to the second terminal of the second PMOS transistor, a second terminal connected to ground, and a gate terminal connected to the output terminal of the second inverter, wherein a gate terminal of the first PMOS transistor is connected to the second terminal or the second PMOS transistor, and wherein a gate terminal of the second PMOS transistor is connected to the second terminal of the first PMOS transistor.

* * * * *